(12) United States Patent
Shin et al.

(10) Patent No.: US 11,538,415 B2
(45) Date of Patent: Dec. 27, 2022

(54) CLOCK AND VOLTAGE GENERATION CIRCUIT AND DISPLAY DEVICE INCLUDING THE SAME

(71) Applicant: SAMSUNG DISPLAY CO., LTD., Yongin-si (KR)

(72) Inventors: Byunghyuk Shin, Seoul (KR); Soyoung Kim, Yongin-Si (KR); Donghak Pyo, Hwaseong-Si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 25 days.

(21) Appl. No.: 17/256,500

(22) PCT Filed: Apr. 5, 2019

(86) PCT No.: PCT/KR2019/004111
§ 371 (c)(1),
(2) Date: Dec. 28, 2020

(87) PCT Pub. No.: WO2020/027403
PCT Pub. Date: Feb. 6, 2020

(65) Prior Publication Data
US 2021/0280136 A1 Sep. 9, 2021

(30) Foreign Application Priority Data
Aug. 3, 2018 (KR) .................. 10-2018-0090841

(51) Int. Cl.
*G09G 3/3266* (2016.01)
*G09G 3/3258* (2016.01)
(Continued)

(52) U.S. Cl.
CPC ......... *G09G 3/3266* (2013.01); *G09G 3/3258* (2013.01); *G09G 3/3291* (2013.01);
(Continued)

(58) Field of Classification Search
CPC ............... G09G 3/3677; G09G 3/3266; G09G 2310/0286; G09G 2310/0289;
(Continued)

(56) References Cited

U.S. PATENT DOCUMENTS 9,024,857 B2 5/2015 Ahn et al.
10,176,760 B2 1/2019 Park et al.
(Continued)

FOREIGN PATENT DOCUMENTS

KR       100878232 B1     1/2009
KR    1020140041023 A     4/2014
(Continued)

OTHER PUBLICATIONS

Written Opinion for PCT/KR2019/004111 dated Jul. 10, 2019.
International Search Report for PCT/KR2019/004111 dated Jul. 10, 2019.

*Primary Examiner* — Xuemei Zheng
(74) *Attorney, Agent, or Firm* — Cantor Colburn LLP

(57) ABSTRACT

A clock and voltage generation circuit includes a voltage generator which generates a first gate high voltage, a first gate low voltage, a second gate high voltage, and a second gate low voltage, a first level shifter which generates a first gate clock signal which swings between the first gate high voltage and the first gate low voltage in synchronization with a gate pulse signal, and a second level shifter which generates a second gate clock signal which swings between the second gate high voltage and the second gate low voltage in synchronization with the gate pulse signal. The voltage generator lowers the second gate high voltage to a voltage level of a kickback reference voltage in response to a kickback signal, and the first gate low voltage and the (Continued)

second gate high voltage are gate-on voltages, and the first gate high voltage and the second gate low voltage are gate-off voltages.

19 Claims, 10 Drawing Sheets

(51) Int. Cl.
  *G09G 3/3291* (2016.01)
  *H01L 27/32* (2006.01)
  *H01L 27/12* (2006.01)
  *H01L 29/786* (2006.01)
(52) U.S. Cl.
  CPC . *H01L 27/3262* (2013.01); *G09G 2300/0426* (2013.01); *G09G 2310/0289* (2013.01); *G09G 2310/08* (2013.01); *H01L 27/1225* (2013.01); *H01L 27/1251* (2013.01); *H01L 29/7869* (2013.01); *H01L 29/78672* (2013.01)
(58) Field of Classification Search
  CPC ... G09G 2300/0426; G09G 2300/0819; G09G 2320/0233; G09G 3/3258; G09G 3/3291; H01L 27/3262; H01L 27/1251; H01L 27/1225; H01L 29/78672; H01L 29/7869
  See application file for complete search history.

(56) References Cited

U.S. PATENT DOCUMENTS

| | | | |
|---|---|---|---|
| 10,381,426 B2 | 8/2019 | Ka et al. | |
| 10,490,617 B2 | 11/2019 | Kim et al. | |
| 10,777,133 B2 | 9/2020 | Jeon et al. | |
| 2008/0136809 A1* | 6/2008 | Lee | G09G 3/3677 345/214 |
| 2013/0215160 A1* | 8/2013 | Pyun | G09G 3/3655 345/94 |
| 2014/0340381 A1* | 11/2014 | Kim | G09G 3/3677 345/212 |
| 2018/0357960 A1* | 12/2018 | Yang | G09G 3/3258 |
| 2019/0088209 A1 | 3/2019 | Kang et al. | |

FOREIGN PATENT DOCUMENTS

| | | |
|---|---|---|
| KR | 1020150070875 A | 6/2015 |
| KR | 20150074613 A | 7/2015 |
| KR | 1020160083347 A | 7/2016 |
| KR | 1020170080350 A | 7/2017 |
| KR | 101769400 B1 | 8/2017 |
| KR | 1020180004369 A | 1/2018 |
| KR | 1020180025354 A | 3/2018 |
| KR | 1020180056442 A | 5/2018 |
| KR | 1020190031403 A | 3/2019 |

* cited by examiner

CLOCK AND VOLTAGE GENERATION CIRCUIT AND DISPLAY DEVICE INCLUDING THE SAME

This application is a National Phase of International Application No. PCT/KR2019/004111 filed on Apr. 5, 2019, which is claims priority of Korean Patent Application No. 10-2018-0090841 filed on Aug. 3, 2018, which is hereby incorporated herein by reference in its entirety for all purposes.

TECHNICAL FIELD

The disclosure herein relates to a clock and voltage generation circuit that generates a plurality of driving voltages, and a display device including the same.

BACKGROUND ART

Among display devices, an organic light-emitting display device displays an image using an organic light emitting diode that generates light by recombination of electrons and holes. Such an organic light emitting diode display has desired features such as fast response speed and low power consumption.

Organic light emitting display devices include pixels connected to data lines and scan lines. Pixels generally include an organic light emitting diode and a circuit unit for controlling an amount of current flowing through the organic light emitting diode. The circuit unit controls the amount of current flowing from a first driving voltage to a second driving voltage through an organic light emitting diode in response to a data signal. In this case, light having a predetermined luminance is generated in response to the amount of current flowing through the organic light emitting diode.

Conventionally, transistors included in a circuit unit are formed of transistors having a low-temperature polycrystalline silicon ("LTPS") semiconductor layer. The LTPS transistor has advantages in terms of high mobility and element stability, but a leakage current occurs when the voltage level of the second driving voltage is lowered or the operating frequency is lowered. When a leakage current occurs in a circuit unit in a pixel, a change in the amount of current flowing through the organic light emitting diode may occur, so that display quality may decrease.

Recently, in order to reduce the leakage current of a transistor in a circuit unit, a transistor having an oxide semiconductor as a semiconductor layer has been studied, and furthermore, research is being conducted on using LTPS semiconductor transistors and oxide semiconductor transistors together in a circuit unit of one pixel.

DISCLOSURE OF THE INVENTION

Technical Problem

A feature of the invention is to provide a clock and power generation circuit capable of improving the quality of an image displayed on a display panel, and a display device including the same.

Technical Solution

Embodiments of the invention provide a clock and voltage generation circuit including: a voltage generator which generates a first gate high voltage, a first gate low voltage, a second gate high voltage, and a second gate low voltage; a first level shifter which generates a first gate clock signal which swings between the first gate high voltage and the first gate low voltage in synchronization with a gate pulse signal; and a second level shifter which generates a second gate clock signal which swings between the second gate high voltage and the second gate low voltage in synchronization with the gate pulse signal, where the voltage generator lowers the second gate high voltage to a voltage level of a kickback reference voltage in response to a kickback signal, wherein the first gate low voltage and the second gate high voltage are gate-on voltages, and the first gate high voltage and the second gate low voltage are gate-off voltages.

In an embodiment, the first gate high voltage and the second gate high voltage may be different voltage levels from each other.

In an embodiment, the first gate low voltage and the second gate high voltage may be different voltage levels from each other.

In an embodiment, the voltage generator may include: a voltage converter which receives a power voltage, converts the power voltage to the first gate high voltage, the first gate low voltage, the second gate high voltage, and the second gate low voltage, and outputs the first gate high voltage, the first gate low voltage, the second gate high voltage and the second gate low voltage; and a pulse modulation circuit which lowers the second gate high voltage to a voltage level of the kickback reference voltage in response to the kickback signal.

In an embodiment, the pulse modulation circuit may include: a controller which outputs a kickback enable signal and the kickback reference voltage in response to the kickback signal; a first switching transistor including a first electrode connected to a first node to which the second gate high voltage is outputted, a second electrode connected to a second node, and a gate electrode which receives the kickback enable signal; a comparator which compare the kickback reference voltage and a feedback voltage and outputs a discharge signal; and a second switching transistor including a first electrode connected to the second node, a second electrode connected to a third node, and a gate electrode which receives the discharge signal; and a resistor connected between the third node and a ground voltage, where a voltage of the third node may be provided to the comparator as the feedback voltage.

In an embodiment, the controller may include: an enable controller which outputs the kickback enable signal corresponding to the kickback signal; a register which stores kickback reference voltage data corresponding to the kickback reference voltage; and a digital-to-analog converter which converts the kickback reference voltage data into the kickback reference voltage.

In other embodiments of the invention, a display device includes: a display panel including a plurality of pixels respectively connected to a plurality of scan lines and a plurality of data lines; a gate driver which receives a first gate clock signal and a second gate clock signal and drives the plurality of scan lines; a data driver which drives the plurality of data lines; a clock and voltage generation circuit which generates a first gate high voltage, a first gate low voltage, a second gate high voltage, and a second gate low voltage in response to a kickback signal and a gate pulse signal; and a timing controller which controls the gate driver and the data driver, and provide a gate pulse signal and a kickback signal to the clock and voltage generation circuit, where the clock and voltage generation circuit lowers the second gate high voltage to a voltage level of a kickback reference voltage in response to the kickback signal, generates the first gate clock signal which swings between the first gate high voltage and the first gate low voltage in synchronization with the gate pulse signal, and generates the second gate clock signal which swings between the second gate high voltage and the second gate low voltage in synchronization with the gate pulse signal, where the first gate high voltage and the second gate high voltage are different voltage levels from each other.

In an embodiment, a pixel of the plurality of pixels may include: a light emitting diode including an anode and a cathode; a first transistor including a first electrode connected to a first driving voltage, a second electrode electrically connected to the anode of the light emitting diode, and a gate electrode; a second transistor including a first electrode connected to a corresponding data line among the plurality of data lines and a gate electrode connected to the first electrode of the first transistor and which receives a first scan signal; and a third transistor including a first electrode connected to the second electrode of the first transistor, a second electrode connected to the gate electrode of the second transistor, and a gate electrode connected to a second scan signal, where the gate driver may generate the first scan signal in synchronization with the first gate clock signal, and generate the second scan signal in synchronization with the second gate clock signal.

In an embodiment, each of the first transistor and the second transistor may be a P-type transistor, and the third transistor may be an N-type transistor.

In an embodiment, each of the first transistor and the second transistor may be a low-temperature polycrystalline silicon ("LTPS") semiconductor transistor, and the third transistor may be an oxide semiconductor transistor.

In an embodiment, the display device may further include: a fourth transistor including a first electrode connected to the gate electrode of the first transistor, a second electrode connected to an initialization voltage line, and a gate electrode which receives a third scan signal; a fifth transistor including a first electrode connected to the first driving voltage, a second electrode connected to the first electrode of the first transistor, and a control electrode which receives an emission control signal; a sixth transistor including a first electrode connected to the second electrode of the first transistor, a second electrode connected to the anode of the light emitting diode, and a gate electrode which receives the emission control signal; and a seventh transistor including a first electrode connected to the second electrode of the fourth transistor, a second electrode connected to the anode of the light emitting diode, and a gate electrode which receives a fourth scan signal, where the gate driver may generate the third scan signal in synchronization with the second gate clock signal, and generate the fourth scan signal in synchronization with the first gate clock signal.

In an embodiment, the fourth transistor may be an N-type transistor, and each of the fifth to seventh transistors may be a P-type transistor.

In an embodiment, the fourth transistor may be an oxide semiconductor transistor, and each of the fifth to seventh transistors may be an LTPS semiconductor transistor.

In an embodiment, the first gate low voltage and the second gate high voltage may be different voltage levels.

In an embodiment, the clock and voltage generation circuit may include: a voltage generator which generates the first gate high voltage, the first gate low voltage, the second gate high voltage, and the second gate low voltage in response to the kickback signal; a first level shifter which generates the first gate clock signal which swings between the first gate high voltage and the first gate low voltage in synchronization with the gate pulse signal; and a second level shifter which generates the second gate clock signal which swings between the second gate high voltage and the second gate low voltage in synchronization with the gate pulse signal.

In an embodiment, the voltage generator may include: a voltage converter which receives a power voltage, convert the power voltage to the first gate high voltage, the first gate low voltage, the second gate high voltage, and the second gate low voltage, and output the first gate high voltage, the first gate low voltage, the second gate high voltage and the second gate low voltage to first to fourth terminals, respectively; and a pulse modulation circuit which lowers the second gate high voltage to the voltage level of the kickback reference voltage in response to the kickback signal.

In an embodiment, the pulse modulation circuit may include: a controller which outputs a kickback enable signal and the kickback reference voltage in response to the kickback signal; a first switching transistor including a first electrode connected to a first node to which the second gate high voltage is outputted, a second electrode connected to a second node, and a gate electrode connected to the kickback enable signal; a comparator which compares the kickback reference voltage and a feedback voltage and output a discharge signal; and a second switching transistor including a first electrode connected to the second node, a second electrode connected to a third node, and a gate electrode which receives the discharge signal; and a resistor connected between the third node and a ground voltage, wherein a voltage of the third node may be provided to the comparator as the feedback voltage.

In an embodiment, the controller may include: an enable controller which outputs the kickback enable signal corresponding to the kickback signal; a register which stores kickback reference voltage data corresponding to the kickback reference voltage; and a digital-analog converter which converts the kickback reference voltage data into the kickback reference voltage.

In an embodiment, the first level shifter may include: a first P-type transistor including a first electrode connected to the first gate high voltage, a second electrode connected to a first output node, and a gate electrode which receives the gate pulse signal; and a first N-type transistor including a first electrode connected to the first output node, a second electrode connected to the first gate low voltage, and a gate electrode which receives the gate pulse signal.

In an embodiment, the second level shifter may include: a second P-type transistor including a first electrode connected to the second gate high voltage, a second electrode connected to a second output node, and a gate electrode which receives the gate pulse signal; and a second N-type transistor including a first electrode connected to the second output node, a second electrode connected to the second gate low voltage, and a gate electrode which receives the gate pulse signal.

Advantageous Effects

A display device having such a configuration provides a first scan signal to the gate electrode of an LTPS semiconductor transistor in a pixel in synchronization with a first gate clock signal, and provides a second scan signal to the gate electrode of an oxide semiconductor transistor in a pixel in synchronization with the second gate clock signal. In particular, the clock and voltage generation circuit of the display device modulates the second gate clock signal to minimize the influence of the coupling capacitance between the gate-drain electrodes of the oxide semiconductor transistor at the falling edge of the second scan signal. Accordingly, it is possible to prevent the display quality from deteriorating at the falling edge of the second scan signal.

MODE FOR CARRYING OUT THE INVENTION

Figure 1:
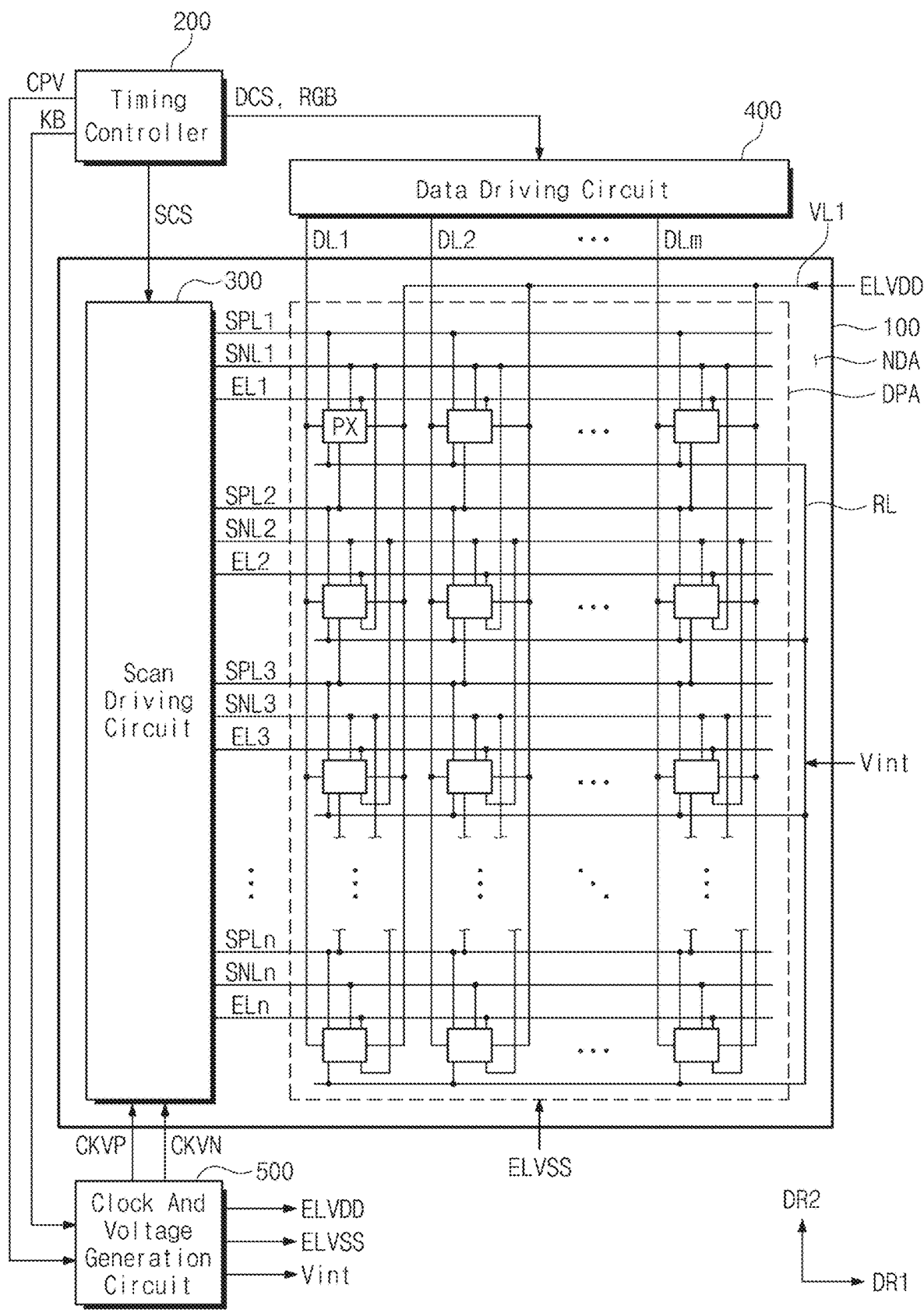
FIG. 1 is a block diagram of an organic light emitting diode display according to an embodiment of the invention.

In this specification, when an element (or region, layer, part, etc.) is referred to as being "on", "connected to", or "coupled to" another element, it means that it can be directly placed on/connected to/coupled to other components, or a third component can be arranged between them.

Like reference numerals refer to like elements. Additionally, in the drawings, the thicknesses, proportions, and dimensions of components are exaggerated for effective description.

"And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the inventive concept. The terms of a singular form may include plural forms unless otherwise specified.

In addition, terms such as "below", "the lower side", "on", and "the upper side" are used to describe a relationship of configurations shown in the drawing. The terms are described as a relative concept based on a direction shown in the drawing.

Unless otherwise defined, all terms (including technical and scientific terms) used herein have the same meaning as commonly understood by one of ordinary skill in the art to which this invention belongs. In addition, terms defined in a commonly used dictionary should be interpreted as having a meaning consistent with the meaning in the context of the related technology, and unless interpreted in an ideal or overly formal sense, the terms are explicitly defined herein.

In various embodiments of the inventive concept, the term "include," "comprise," "including," or "comprising," specifies a property, a region, a fixed number, a step, a process, an element and/or a component but does not exclude other properties, regions, fixed numbers, steps, processes, elements and/or components.

Hereinafter, embodiments of the invention will be described with reference to the drawings.

FIG. 1 is a block diagram of an organic light emitting diode display according to an embodiment of the invention.

Referring to FIG. 1, an organic light emitting display device includes a display substrate 100, a timing controller 200, a scan driving circuit 300, a data driving circuit 400, and a clock and voltage generation circuit 500.

The timing controller 200 receives input image signals (not shown), converts the data format of the input image signals to meet the specifications of an interface with the data driving circuit 400 to generate image data RGB. The timing controller 200 outputs a scan control signal SCS, image data RGB, a data control signal DCS, a gate pulse signal CPV, and a kickback signal KB.

The scan driving circuit 300 receives a scan control signal SCS from the timing controller 200 and receives a first gate clock signal CKVP and a second gate clock signal CKVN from the clock and voltage generation circuit 500. The scan control signal SCS may include a vertical start signal for starting the operation of the scan driving circuit 300, a clock signal for determining output timing of the signals, and the like. The scan driving circuit 300 generates a plurality of scan signals, and sequentially outputs the plurality of scan signals to a plurality of scan lines SL1 to SLn to be described later. In addition, the scan driving circuit 300 generates a plurality of emission control signals in response to the scan control signal SCS, and outputs a plurality of emission control signals to a plurality of control lines EL1-ELn to be described later.

FIG. 1 illustrates an embodiment where a plurality of scan signals and a plurality of emission control signals are outputted from one scan driving circuit 300, but the invention is not limited thereto. In an alternative embodiment of the invention, a plurality of scan driving circuits may divide and output a plurality of scan signals, and may divide and output a plurality of emission control signals. In another alternative embodiment of the invention, a driving circuit that generates and outputs a plurality of scan signals and a driving circuit that generates and outputs a plurality of emission control signals may be separately classified.

The data driving circuit 400 receives a data control signal DCS and image data RGB from the timing controller 200. The data driving circuit 400 converts the image data RGB into data signals, and outputs the data signals to a plurality of data lines DL1 to DLm to be described later. The data signals are analog voltages corresponding to gradation or grayscale values of the image data RGB.

The clock and voltage generation circuit 500 receives the gate pulse signal CPV and the kickback signal KB, and generates voltages used for the operation of the organic light emitting display device. In this embodiment, the clock and voltage generation circuit 500 generates a first driving voltage ELVDD, a second driving voltage ELVSS, an initialization voltage Vint, a first gate clock signal CKVP, and a second gate clock signal CKVN.

The display substrate 100 includes first type scan lines SPL1 to SPLn, second type scan lines SNL1 to SNLn, control lines EL1 to ELn, data lines DL1 to DLm, and pixels PX. The first type scan lines SPL1-SPLn and the second type scan lines SNL1-SNLn extend in a first direction DR1 and are arranged to be spaced apart from each other in a second direction DR2.

Each of the plurality of control lines EL1-ELn may be arranged parallel to a corresponding scan line among the second type scan lines SNL1-SNLn.

Each of the plurality of pixels PX is connected to a corresponding first type scan line among the first type scan lines SPL1-SPLn, a corresponding second type scan line among the second type scan lines SNL1-SNLn, a corresponding control line among the control lines EL1-ELn, and a corresponding data lines among the data lines DL1 to DLm. In an embodiment, each of the plurality of pixels PX is connected to a corresponding third driving voltage line among third driving voltage lines.

Each of the plurality of pixels PX receives a first driving voltage ELVDD, and a second driving voltage ELVSS having a lower level than the first driving voltage ELVDD. Each of the plurality of pixels PX may further receive a third driving voltage through the corresponding third driving voltage line. Each of the pixels PX is connected to a first driving voltage line (not shown) to which the first driving voltage ELVDD is applied. Each of the pixels PX is connected to an initialization line RL to receive an initialization voltage Vint.

Each of the plurality of pixels PX may be electrically connected to four scan lines. As shown in FIG. 1, the pixels in the second pixel row may be connected to scan lines SNL1, SPL2, SNL2, and SPL3.

Each of the plurality of pixels PX includes an organic light emitting diode (not shown) and a circuit unit (not shown) of a pixel that controls light emission of the light emitting diode. The pixel circuit unit may include a plurality of transistors and a capacitor. At least one of the scan driving circuit 300 and the data driving circuit 400 may include transistors formed through the same process as the pixel circuit unit.

The first type scan lines SPL1-SPLn, the second type scan lines SNL1-SNLn, the control lines EL1-ELn, the data lines DL1-DLm, the first driving voltage lines, the initialization line RL, the pixels PX, the scan driving circuit 300, and the data driving circuit 400 may be formed on a base substrate (not shown) through a plurality of photolithography processes. Insulation layers may be formed on the base substrate (not shown) through a plurality of deposition processes or coating processes. Each of the insulating layers may be a thin film covering the entire display substrate 100, or may include at least one insulating pattern overlapping only a specific configuration of the display substrate 100. The insulating layers include an organic layer and/or an inorganic layer. In addition, a sealing layer (not shown) protecting the pixels PX may be further formed on the base substrate.

The display substrate 100 receives a first driving voltage ELVDD and a second driving voltage ELVSS. The first driving voltage ELVDD may be provided to the plurality of pixels PX through the first driving voltage line 172. The second driving voltage ELVSS may be provided to the plurality of pixels PX through electrodes (not shown) or a power line (not shown) formed on the display substrate 100.

The display substrate 100 receives the initialization voltage Vint. The initialization voltage Vint may be provided to the plurality of pixels PX through the initialization voltage line RL.

The display substrate 100 is divided into a display area DPA and a non-display area NDA. The plurality of pixels PX are arranged in the display area DPA. In this embodiment, the scan driving circuit 300 is arranged in the non-display area NDA, which is adjacent to one side of the display area DPA.

Figure 2:
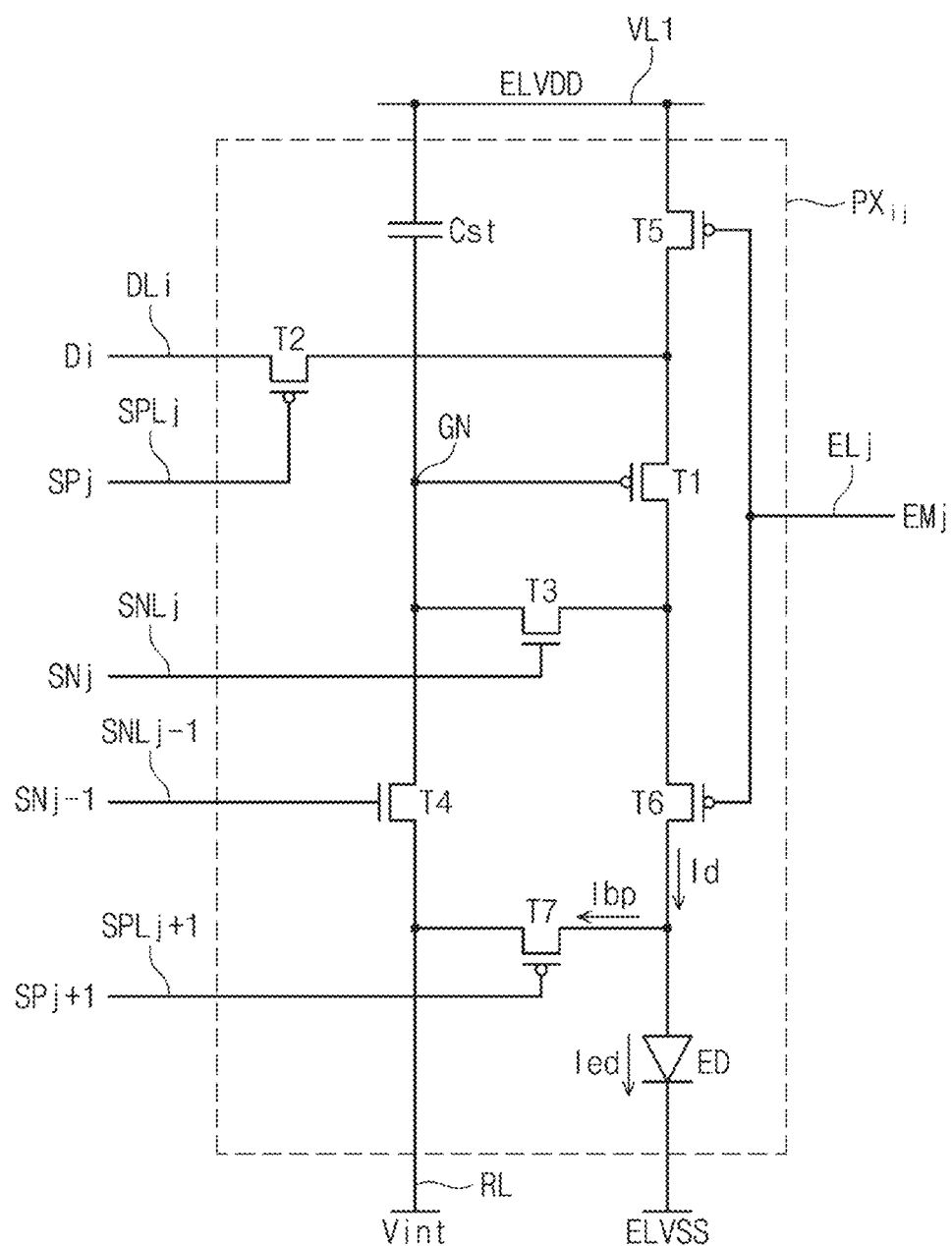
FIG. 2 is an equivalent circuit diagram of a pixel in an organic light emitting diode display according to an embodiment of the invention.
Figure 3:
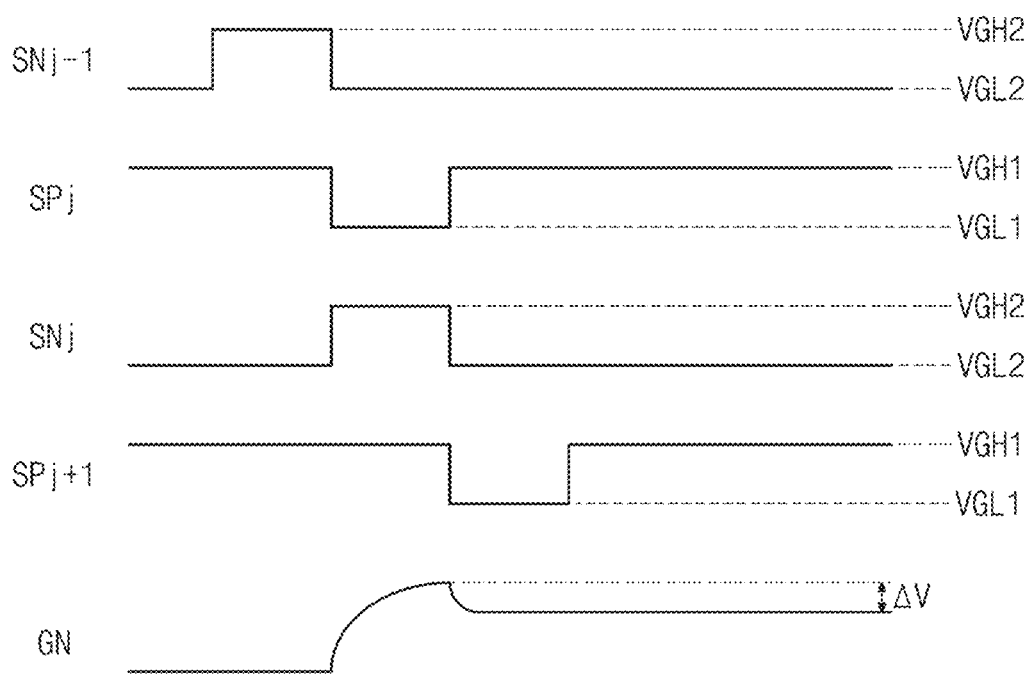
FIG. 3 is a waveform diagram illustrating driving signals for driving the pixel shown in FIG. 2.

FIG. 2 is an equivalent circuit diagram of a pixel according to an embodiment of the invention. FIG. 3 is a timing diagram illustrating an operation of a pixel of an organic light emitting diode display of FIG. 2.

FIG. 2 exemplarily shows an equivalent circuit diagram of the pixel PXij connected to the i-th data line DLi among the plurality of data lines DL1 to DLm, the j-th first type scan line SPLj and the (j+1)-th first type scan line SPLj+1 among the plurality of first type scan lines SPL1-SPLn, the j-th second type scan line SNLj and the (j−1)-th second type scan line SNLj−1 among the plurality of second type scan lines SNL1-SNLn, and the j-th control line ELj among the plurality of control lines EL1-ELj, which are shown in FIG. 1. Each of the plurality of pixels PX illustrated in FIG. 1 may have the same circuit configuration as the equivalent circuit diagram of the pixel PXij illustrated in FIG. 2. In this embodiment, the circuit unit of the pixel PXij includes first to seventh transistors T1 to T7 and one capacitor Cst. In addition, each of the first, second, fifth, sixth, and seventh transistors T1, T2, T5, T6, and T7 is a P-type transistor having a low-temperature polycrystalline silicon ("LTPS") semiconductor layer, and each of the third and fourth transistors T3 and T4 is an N-type transistor having an oxide semiconductor as a semiconductor layer. However, the invention is not limited thereto, and at least one of the first to seventh transistors T1 to T7 may be an N-type transistor and the rest may be a P-type transistor. Further, the circuit configuration of the pixel according to the invention is not limited to FIG. 2. The circuit unit shown in FIG. 2 is merely exemplary, and the configuration of the circuit unit may be modified and implemented.

Referring to FIG. 2, a pixel PXij of the display device according to an embodiment includes first to seventh transistors T1, T2, T3, T4, T5, T6, and T7, a capacitor Cst, and at least one light emitting diode ED. Hereinafter, for convenience of description, an embodiment where one pixel PXij includes one light emitting diode ED as shown in FIG. 2 will be described in detail.

For convenience of description, the j-th first type scan line SPLj, the j-th second type scan line SNLj, the (j−1)-th second type scan line SNLj−1, and the (j+1)-th first type scan line SPLj+1 will be referred to as a first scan line SPLj, a second scan line SNLj, a third scan line SNLj−1, and a fourth scan line SPLj+1.

The first to fourth scan lines SPLj, SNLj, SNLj−1, and SPLj+1 may respectively transmit scan signals SPj, SNj, SNj−1, and SPj+1. The scan signals SPj and SPj+1 may transmit a first gate low voltage and a first gate high voltage to turn on/off the second and seventh transistors T2 and T7, which are P-type transistors. The scan signals SNj and SNj−1 may transmit a second gate high voltage and a second gate low voltage to turn on/off the third and fourth transistors T3 and T4, which are N-type transistors.

The control line ELj may transmit the emission control signal EMj, and in particular, may transmit an emission control signal capable of controlling light emission of the light emitting diode ED included in the pixel PXij. The emission control signal transmitted by the control line ELj may have a different waveform than the scan signals SPj, SNj, SNj−1, and SPj+1 transmitted by the first to fourth scan lines SPLj, SNLj, SNLj−1, and SPLj+1. The data line DLi may transmit the data signal Di, and the first driving voltage line VL1 may transmit the first driving voltage ELVDD. The data signal Di may have a different voltage level corresponding to an image signal inputted to the display device, and the first driving voltage ELVDD may have a substantially constant level.

The first transistor T1 includes a first electrode connected to the first driving voltage line 172 through a fifth transistor T5, a second electrode electrically connected to the anode of the light emitting diode ED through the sixth transistor T6, and a gate electrode connected to one end of the capacitor Cst. The first transistor T1 may receive the data signal Di transmitted from the data line DL based on the switching operation of the second transistor T2 and supply the driving current Id to the light emitting diode ED.

The second transistor T2 includes a first electrode connected to the data line DLi, a second electrode connected to the first electrode of the first transistor T1, and a gate electrode connected to the first scan line SPLj. The second transistor T2 is turned on in response to the scan signal SPj received through the first scan line SPLj to transmit the data signal Di transmitted from the data line DLi to the first source electrode S1 of the first transistor T1.

The third transistor T3 may include a first electrode connected to the gate electrode of the first transistor T1, a second electrode connected to the second electrode of the first transistor T1, and a gate electrode connected to the second scan line SNLj. The third transistor T3 is turned on in response to the scan signal SNj received through the second scan line SNLj to diode-connect the first transistor T1 by connecting the gate electrode and the second electrode of the first transistor T1 to each other.

The fourth transistor T4 includes a first electrode connected to the gate electrode of the first transistor T1, a second electrode connected to the initialization voltage line RL through which the initialization voltage Vint is transmitted, and gate electrode connected to the a third scan line SNLj−1. The fourth transistor T4 is turned on in response to the scan signal SNj−1 received through the third scan line SNLj−1 to transmit the initialization voltage Vint to the gate electrode of the first transistor T1, thereby performing an initialization operation of initializing the voltage of the gate electrode of the first transistor T1.

The fifth transistor T5 includes a first electrode connected to the first driving voltage line VL1, a second electrode connected to the first electrode of the first transistor T1, and a gate electrode connected to the j-th control line ELj.

The sixth transistor T6 includes a first electrode connected to the first electrode of the first transistor T1, a second electrode connected to the anode of the light emitting diode ED, and a gate electrode connected to the j-th control line ELj.

The fifth transistor T5 and the sixth transistor T6 are simultaneously turned on according to the emission control signal EMj transmitted through the j-th control line ELj and through this, the first driving voltage ELVDD may be compensated through the diode-connected first transistor T1 and transmitted to the light emitting diode ED.

The seventh transistor T7 includes a first electrode connected to the second electrode of the fourth transistor T4, a second electrode connected to the second electrode of the sixth transistor T6, and a gate electrode connected to the fourth scan line SPLj+1.

As described above, one end of the capacitor Cst is connected to the gate electrode of the first transistor T1 and the other end is connected to the first driving voltage line VL1. The cathode of the light emitting diode ED may be connected to a terminal transmitting the second driving voltage ELVSS. The structure of an embodiment of the pixel PXij is not limited to the structure illustrated in FIG. 2, and the number of transistors and the number of capacitors included in one pixel PX, and a connection relationship can be variously modified.

An operation of the display device according to an embodiment will be described with reference to FIG. 3 together with FIG. 2 described above.

Referring to FIGS. 2 and 3, a third scan signal SNj−1 having a second gate high voltage VGH2 level is supplied through a third scan line SNLj−1 during an initialization period within one frame. The fourth transistor T4 is turned on in response to the third scan signal SNj−1 of the second gate high voltage VGH2 level, and the initialization voltage Vint is transmitted to the gate electrode of the first transistor T1 through the fourth transistor T4 so that the first transistor T1 is initialized.

Next, when the first scan signal SPj of the first gate low voltage VGL1 level is supplied through the first scan line SPLj during data programming and compensation period within one frame, the second transistor T2 is turned on, and at the same time, when the second scan signal SNj of the second gate high voltage VGH2 level is supplied through the second scan line SNLj, the third transistor T3 is turned on. At this time, the first transistor T1 is diode-connected by the turned-on third transistor T3 and is biased in the forward direction. Then, the compensation voltage (Di-Vth) reduced by the threshold voltage (Vth) of the first transistor T1 from the data signal Di supplied from the data line DLi is applied to the gate electrode of the first transistor T1. That is, the gate voltage applied to the gate electrode of the first transistor T1 may be the compensation voltage Di-Vth.

A first driving voltage ELVDD and a compensation voltage Di-Vth are applied to both ends of the capacitor Cst, and a charge corresponding to a voltage difference between both ends may be stored in the capacitor Cst.

During the bypass period, the seventh transistor T7 is turned on by receiving the low-level scan signal SPLj+1 through the fourth scan line SPLj+1. A portion of the driving current Id may escape through the seventh transistor T7 as a bypass current Ibp by the seventh transistor T7.

Even when the minimum current of the first transistor T1 for displaying a black image flows as the driving current, if the light emitting diode ED emits light, a black image is not properly displayed. Accordingly, in such an embodiment, the seventh transistor T7 of the organic light emitting display device may distribute a portion of the minimum current of the first transistor T1 as the bypass current Ibp to a current path other than the current path toward the organic light emitting diode. Here, the minimum current of the first transistor T1 means a current under a condition in which the first transistor T1 is turned off because the gate-source voltage (Vgs) of the first transistor T1 is less than the threshold voltage (Vth). In this way, the minimum driving current (e.g., a current of 10 pA or less) under the condition of turning off the first transistor T1 is transmitted to the light emitting diode ED, and is expressed as an image of black luminance. It can be said that when the minimum driving current to display a black image flows, the effect of bypass transmission of the bypass current Ibp is large, but when a large driving current that displays an image such as a normal or white image flows, there is little effect of the bypass current Ibp. Therefore, when the driving current for displaying a black image flows, the emission current Ied of the light emitting diode ED, which is reduced by the amount of the bypass current Ibp escaped from the driving current Id through the seventh transistor T7, has the minimum amount of current at a level that can reliably represent a black image.

Accordingly, an accurate black luminance image may be implemented using the seventh transistor T7 to improve a contrast ratio. In this embodiment, the bypass signal is the scan signal SPLj+1, but is not limited thereto.

Next, during an emission period within one frame, the emission control signal EMj supplied from the j-th control line ELj is changed from the high level to the low level. During the emission period, the fifth transistor T5 and the sixth transistor T6 are turned on by the low-level emission control signal EMj. Then, a driving current Id corresponding to the voltage difference between the gate voltage of the gate electrode of the first transistor T1 and the first driving voltage ELVDD is generated, and the driving current Id is supplied to the light emitting diode ED through the sixth transistor T6, so that the current Ied flows through the light emitting diode ED. During the light emission period, the gate-source voltage (Vgs) of the first transistor T1 is maintained as '(Di-Vth)-ELVDD' by the capacitor Cst, and according to the current-voltage relationship of the first transistor T1, the driving current Id may be proportional to the square '(Di-ELVDD)' of a value obtained by subtracting the threshold voltage from the driving gate-source voltage. Accordingly, the driving current Id may be determined regardless of the threshold voltage Vth of the first transistor T1.

Figure 4:
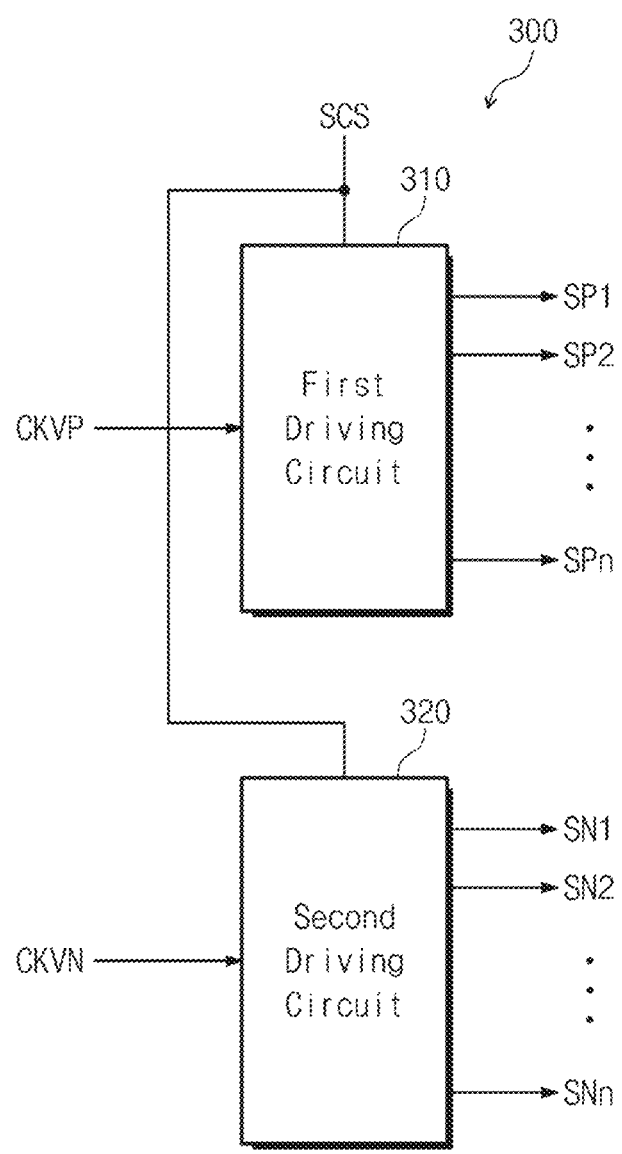
FIG. 4 is a block diagram of a scan driving circuit according to an embodiment of the invention.

FIG. 4 is a block diagram of a scan driving circuit according to an embodiment of the invention.

Referring to FIG. 4, an embodiment of the scan driving circuit 300 includes a first scan driving circuit 310 and a second scan driving circuit 320. The first scan driving circuit 310 receives a scan control signal SCS from the timing controller 200 shown in FIG. 1 and receives a first gate clock signal CKVP from the clock and voltage generation circuit 500, and outputs the scan signals SP1 to SPn. The scan signals SP1-SPn are signals to be provided to the gate electrodes of the first, second, fifth, sixth, and seventh transistors T1, T2, T5, T6, and T7 shown in FIG. 2.

The second scan driving circuit 320 receives a scan control signal SCS from the timing controller 200 shown in FIG. 1 and receives a second gate clock signal CKVN from the clock and voltage generation circuit 500, and outputs the scan signals SN1 to SNn. The scan signals SN1-SNn are signals to be provided to the gate electrodes of the third and fourth transistors T3 and T4 shown in FIG. 2.

Figure 5:
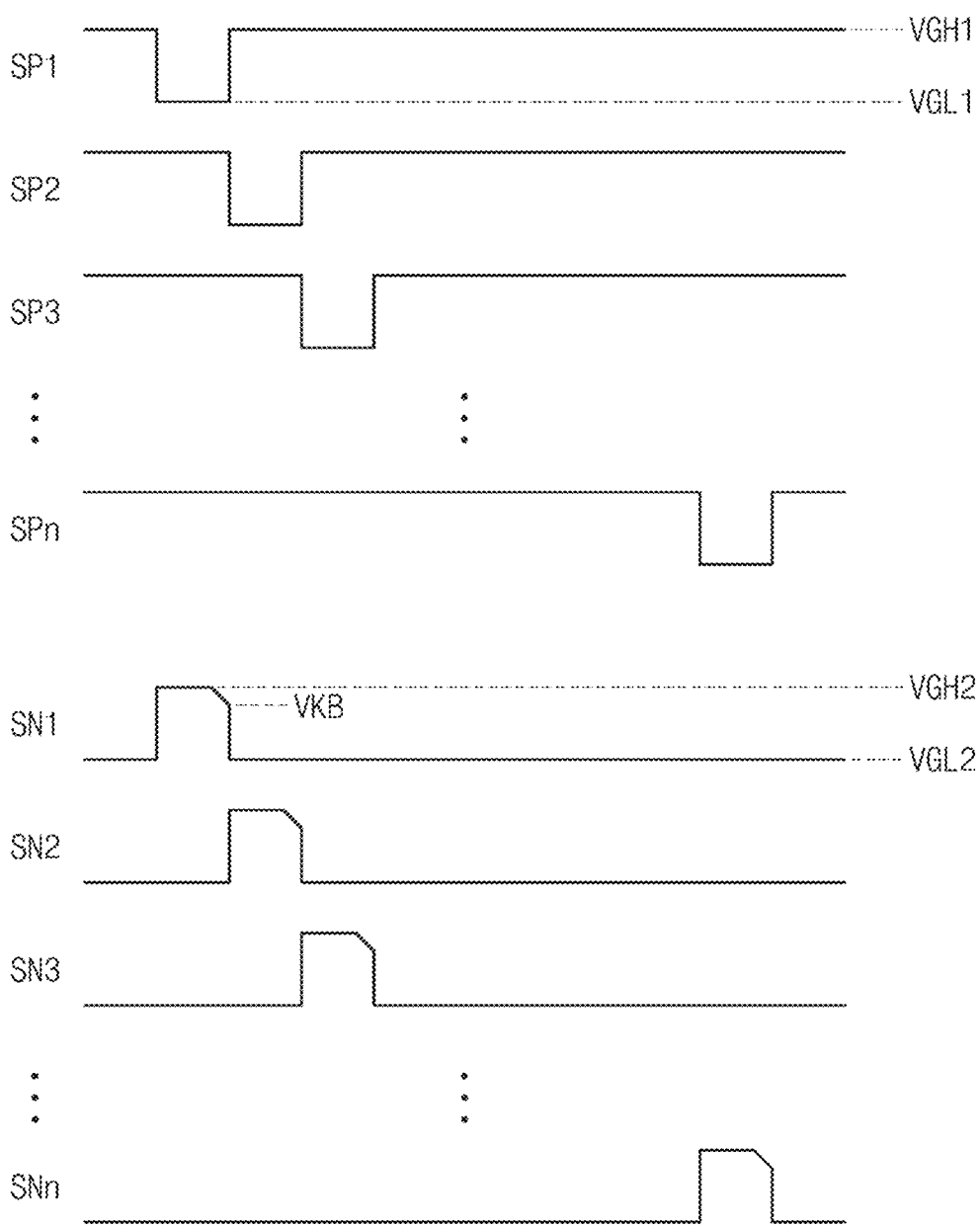
FIG. 5 is a timing diagram of first type scan signals and second type scan signals generated in a scan driving circuit according to an embodiment of the invention.

FIG. 5 is a timing diagram of first type scan signals and second type scan signals generated in a scan driving circuit according to an embodiment of the invention.

Referring to FIGS. 4 and 5, each of the scan signals SP1-SPn outputted from the first scan driving circuit 310 is a pulse signal which swings between the first gate high voltage VGH1 and the first gate low voltage VGL1. The scan signals SP1 to SPn are sequentially activated with the first gate low voltage VGL1.

The scan signals SN1 to SNn outputted from the second scan driving circuit 320 are pulse signals that swing between the second gate low voltage VGL2 and the second gate high voltage VGH2. The scan signals SN1 to SNn are sequentially activated with a second gate high voltage VGH2. In this embodiment, the voltage level of the falling edge of each of the scan signals SN1 to SNn gradually decreases from the second gate high voltage VGH2 to the kickback voltage VKB, and is discharged with the second gate low voltage VGL2.

The first gate high voltage VGH1 and the second gate high voltage VGH2 have different voltage levels from each other, and the first gate low voltage VGL1 and the second gate low voltage VGL2 have different voltage levels from each other.

Referring back to FIGS. 2 and 3, as the first scan signal SPj of the data level of the first gate low voltage VGL1 and the second scan signal SNj of the level of the second gate high voltage VGH2 are supplied during the programming and compensation period of the data third scan signal SNj, the second and third transistors T2 and T3 are turned on. Accordingly, the compensation voltage (Di-Vth) reduced by the threshold voltage (Vth) of the first transistor T1 from the data signal Di supplied from the data line DLi is applied to the gate electrode of the first transistor T1.

When the scan signal SNj provided to the gate electrode of the third transistor T3 changes from the second gate high voltage VGH2 to the second gate low voltage VGL2, by the parasitic capacitance between the gate electrode of the first transistor T1 and the second scan line SNLj, the voltage level of the gate electrode node GN of the first transistor T1 decreases by ΔV (shown in FIG. 3). In this way, a voltage that decreases by ΔV due to the parasitic capacitance is referred to as a kickback voltage. As the voltage difference between the second gate high voltage VGH2 and the second gate low voltage VGL2 increases, the kickback voltage increases.

As the scan signals SN1-SNn outputted from the second scan driving circuit 320 according to an embodiment of the invention gradually decrease from the falling edge to the kickback voltage VKB level and is discharged with the second gate low voltage VGL2, the magnitude of the kickback voltage ΔV can be reduced.

Figure 6:
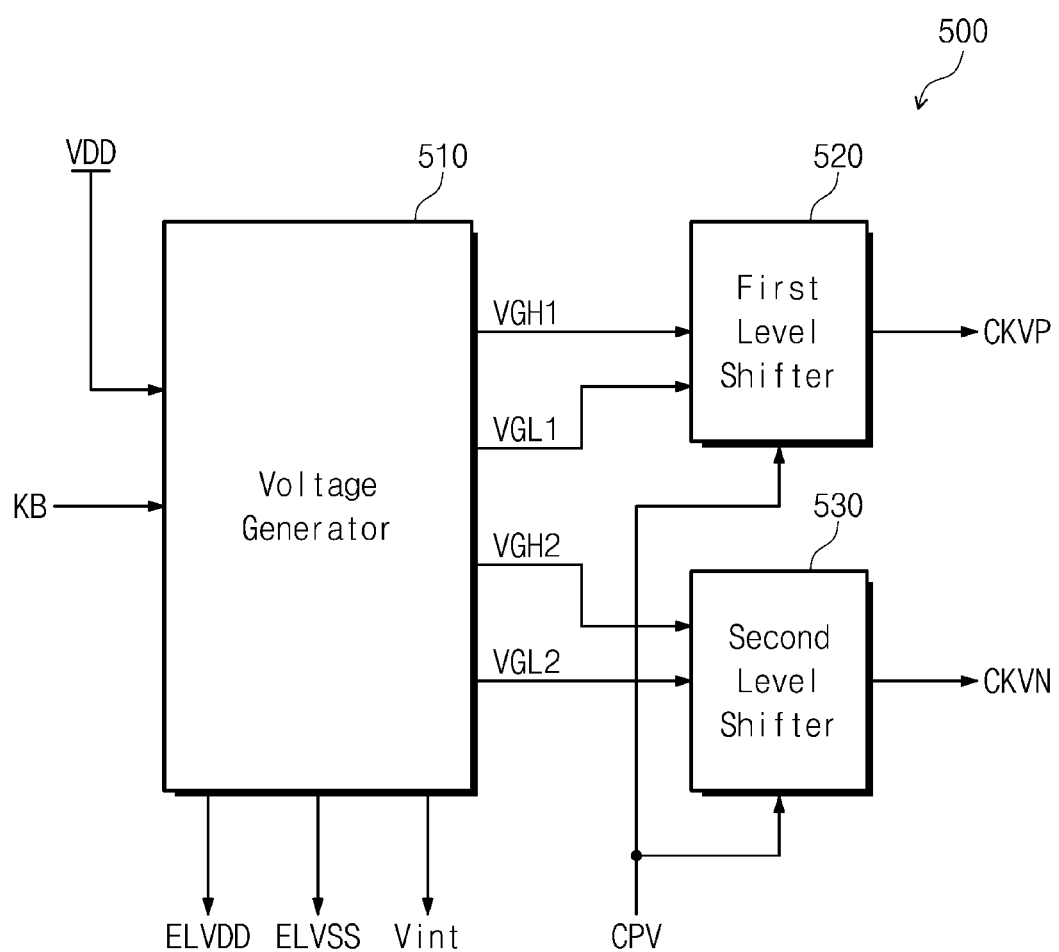
FIG. 6 is a block diagram of a clock and voltage generation circuit according to an embodiment of the invention.

FIG. 6 is a block diagram of a clock and voltage generation circuit according to an embodiment of the invention.

Referring to FIG. 6, an embodiment of a clock and voltage generation circuit 500 includes a voltage generator 510, a first level shifter 520, and a second level shifter 530.

The voltage generator 510 receives the power voltage VDD, and receives the kickback signal KB from the timing controller 200 shown in FIG. 1. The voltage generator 510 generates a first driving voltage ELVDD, a second driving voltage ELVSS, an initialization voltage Vint, a first gate high voltage VGH1, a first gate low voltage VGL1, a second gate high voltage VGH2, and a second gate low voltage VGL2.

The voltage generator 510 lowers the second gate high voltage VGH2 to a predetermined voltage (e.g., the kickback voltage VKB in FIG. 5) in response to the kickback signal KB.

The first gate low voltage VGL1 is a gate-on voltage for turning on the first, second, fifth, sixth, and seventh transistors T1, T2, T5, T6, and T7 shown in FIG. 2, and the second gate high voltage VGH2 is a gate-on voltage for turning on the third and fourth transistors T3 and T4 shown in FIG. 2. In addition, the first gate high voltage VGH1 is a gate-off voltage for turning off the first, second, fifth, sixth, and seventh transistors T1, T2, T5, T6, and T7 shown in FIG. 2, and the second gate low voltage VGL2 is a gate-off voltage for turning off the third and fourth transistors T3 and T4 shown in FIG. 2.

In this embodiment, the first gate high voltage VGH1 and the second gate high voltage VGH2 have different voltage levels from each other, and the first gate low voltage VGL1 and the second gate low voltage VGL2 have different voltage levels from each other.

The first level shifter 520 receives a gate pulse signal CPV from the timing controller 200 shown in FIG. 1 and receives a first gate high voltage VGH1 and a first gate low voltage VGL1 from voltage generator 510. The first level shifter 520 generates a first gate clock signal CKVP which swings between the first gate high voltage VGH1 and the first gate low voltage VGL1 in synchronization with the gate pulse signal CPV. In this embodiment, the first level shifter 520 outputs only the first gate clock signal CKVP, but may further output a gate clock signal complementary to the first gate clock signal CKVP.

The second level shifter 530 receives a gate pulse signal CPV from the timing controller 200 shown in FIG. 1 and receives a second gate high voltage VGH2 and a second gate low voltage VGL2 from the voltage generator 510. The second level shifter 530 generates a second gate clock signal CKVN which swings between the second gate high voltage VGH2 and the second gate low voltage VGL2 in synchronization with the gate pulse signal CPV. In this embodiment, the second level shifter 530 outputs only the second gate clock signal CKVN, but may further output a gate clock signal complementary to the second gate clock signal CKVN.

Figure 7:
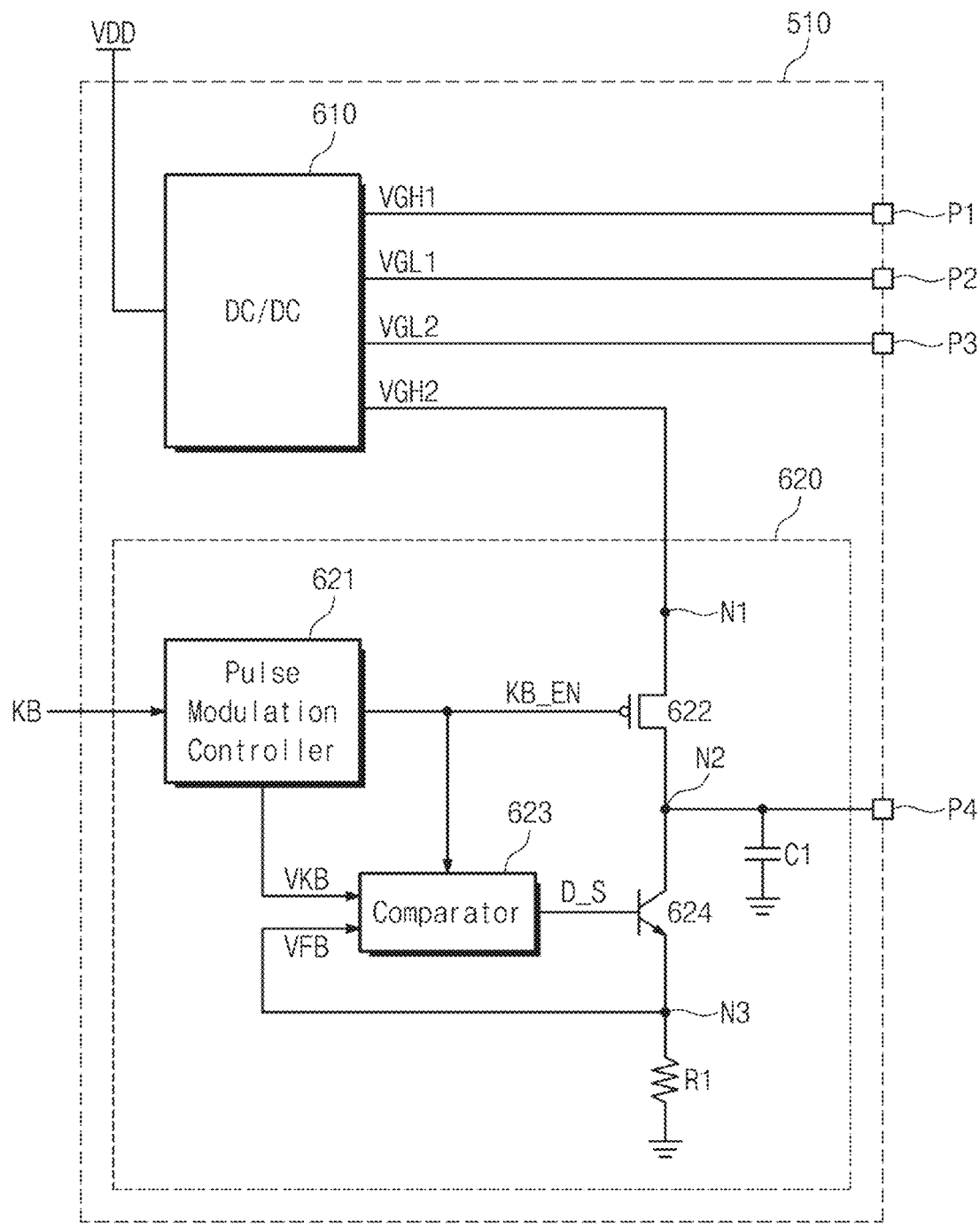
FIG. 7 is a block diagram of a voltage generator according to an embodiment of the invention.

FIG. 7 is a block diagram of a voltage generator according to an embodiment of the invention.

Referring to FIG. 7, an embodiment of a voltage generator 510 includes a direct current-to-direct current ("DC/DC") converter 610, first to fourth terminals P1-P4, and a pulse modulation control circuit 620. The DC/DC converter 610 receives a power voltage VDD and converts the power voltage VDD to a first gate high voltage VGH1, a first gate low voltage VGL1, a second gate high voltage VGH2, and a second gate low voltage VGL2 to output them to the first to fourth terminals P1 to P4, respectively. In one embodiment, for example, the first gate high voltage VGH1, the first gate low voltage VGL1, and the second gate low voltage VGL2 are outputted to the first to third terminals P1 to P3, and the second gate high voltage VGH2 is outputted to the fourth terminal P4 through the pulse modulation control circuit 620.

The pulse modulation control circuit 620 includes a pulse modulation controller 621, first and second switching transistors 622 and 624, a comparator 623, a resistor R1, and a capacitor C1.

The pulse modulation controller 621 receives the second gate high voltage VGH2 and outputs a kickback enable signal KB_EN and a kickback voltage VKB in response to the kickback signal KB. The kickback voltage VKB may also be referred to as a kickback reference voltage, which is a voltage of a predetermined level lower than that of the second gate high voltage VGH2.

The first switching transistor 622 includes a first electrode connected to the first node N1 from which the second gate high voltage VHG2 is outputted, a second electrode connected to the second node N2, and a gate electrode connected to the kickback enable signal KB_EN. In this embodiment, the second node N2 is connected to the fourth terminal P4. The first switching transistor 622 is configured as a P-type metal-oxide-semiconductor ("PMOS") transistor, but may be configured as another type of transistor.

The second switching transistor 624 includes a first electrode connected to the second node N2, a second electrode connected to the third node N3, and a gate electrode connected to the output terminal of the comparator 623. The voltage of the third node N3 is provided to the comparator 623 as a feedback voltage VFB.

The resistor R1 is connected between the third node N3 and the ground voltage. The second switching transistor 624 may be configured as an NPN transistor, but may be configured as another type of transistor. The capacitor C1 is connected between the fourth terminal P4 and the ground voltage.

The comparator 623 compares the kickback voltage VKB from the pulse modulation controller 621 with the feedback voltage VFB of the second node N2, and outputs a discharge signal D_S corresponding to the comparison result to the output terminal. In this embodiment, the comparator 623 outputs a discharge signal D_S corresponding to a result of comparing the kickback voltage VKB and the feedback voltage VFB of the second node N2 while the kickback enable signal KB_EN is at the first level (e.g., the high level).

Figure 8:
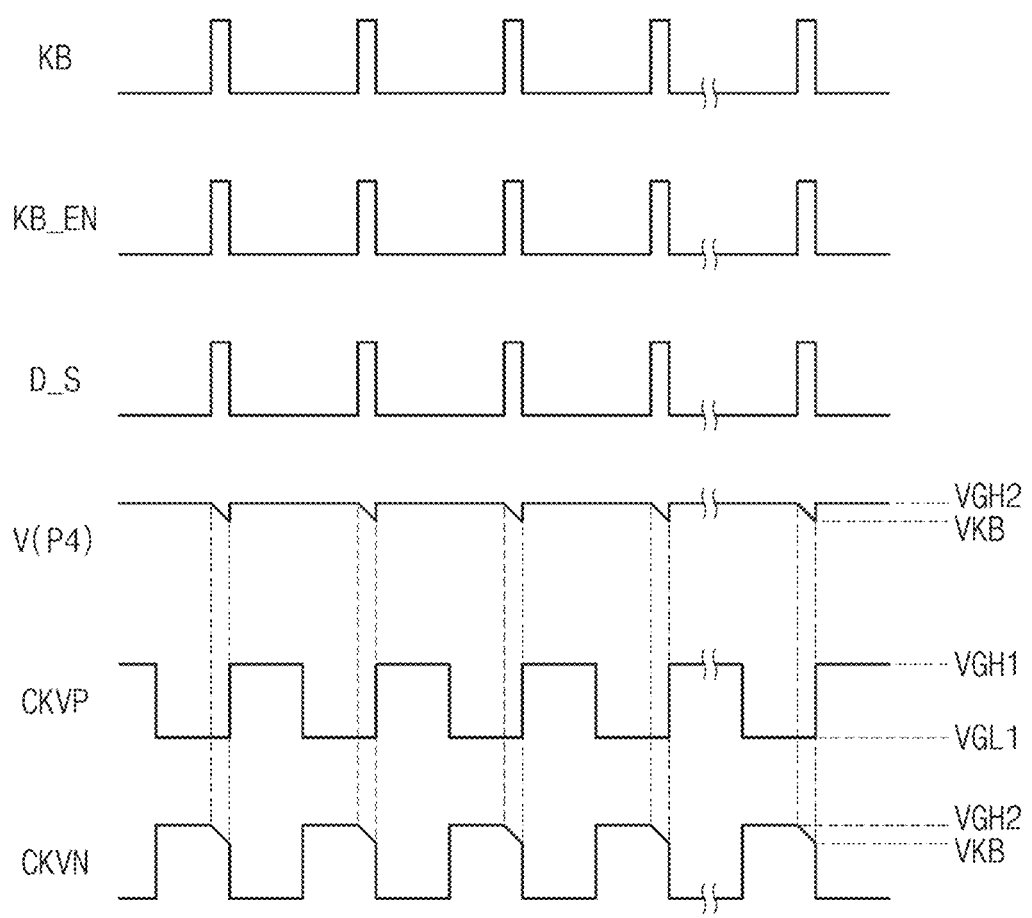
FIG. 8 is a timing diagram illustrating an embodiment of a kickback enable signal and scan signals.

FIG. 8 is a timing diagram illustrating an embodiment of a kickback enable signal and scan signals.

Referring to FIGS. 7 and 8, in an embodiment, the pulse modulation controller 621 receives a kickback signal KB from the timing controller 200 (shown in FIG. 1) and outputs a kickback enable signal KB_EN. In this embodiment, the kickback enable signal KB_EN has the same pulse width as the kickback signal KB. In an alternative embodiment, the pulse modulation controller 621 may output a kickback enable signal KB_EN having a predetermined pulse width in synchronization with the kickback signal KB.

While the kickback enable signal KB_EN is at the first level (e.g., a low level), the first switching transistor 622 outputs the second gate high voltage VGH2 of the first node N1 to the fourth terminal P4 through the second node N2.

While the kickback enable signal KB_EN is at the first level (e.g., the low level), the comparator 623 outputs a low-level signal so that the second switching transistor 624 is maintained in a turned-off state. Accordingly, the second gate high voltage VGH2 is outputted to the fourth terminal P4.

While the kickback enable signal KB_EN is at the second level (e.g., a high level), the first switching transistor 622 is turned off.

While the kickback enable signal KB_EN is at the second level (e.g., the high level), the comparator 623 compares the kickback voltage VKB from the pulse modulation controller 621 with the feedback voltage VFB of the second node N2, and outputs a discharge signal D_S corresponding to the comparison result. When the kickback enable signal KB_EN transitions from the first level (e.g., the high level) to the second level (e.g., high level), since the feedback voltage VFB is at the level of the second gate high voltage VGH2, the discharge signal D_S is at a high level. Since the second switching transistor 624 remains turned on in response to the discharge signal D_S of the high level, the second gate high voltage VGH2 of the fourth terminal P4 is discharged through the resistor RE The voltage level V(P4) of the fourth terminal P4 gradually decreases from the level of the second gate high voltage VGH2 to the kickback voltage VKB.

When the feedback voltage VFB is lower than the kickback voltage VKB, the comparator 623 outputs a low-level discharge signal D_S, and the second switching transistor 624 is turned off.

Thereafter, when the kickback enable signal KB_EN transitions to the first level (e.g. the low level), the first switching transistor 622 is turned on, so that the voltage level V(P4) of the fourth terminal P4 rises to the second gate high voltage VGH2.

Figure 9:
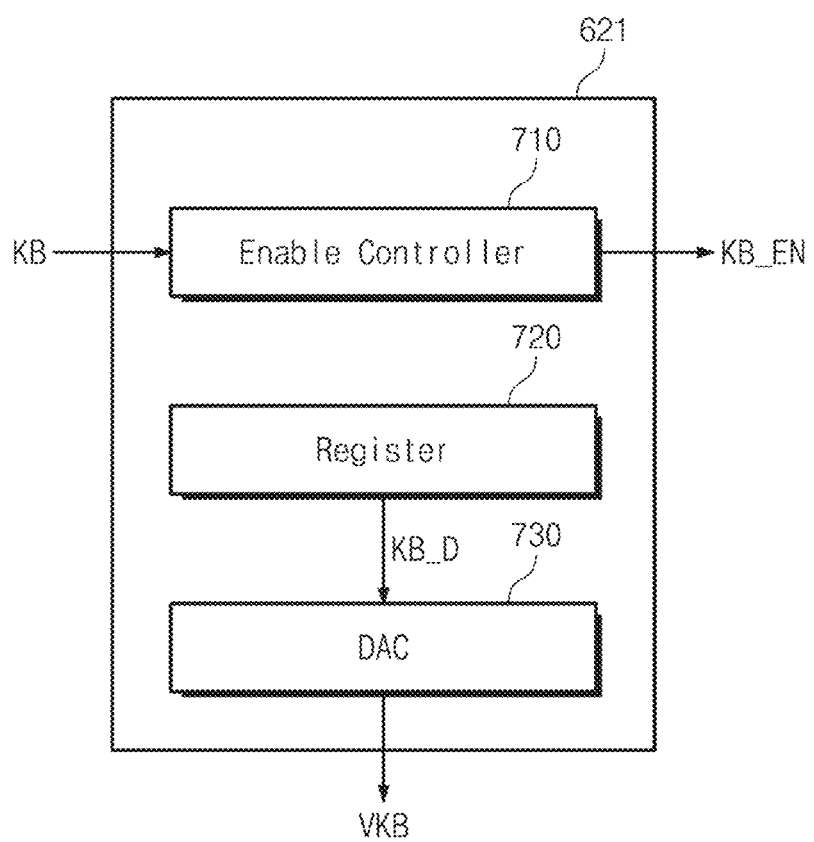
FIG. 9 is a block diagram of a pulse modulation controller according to an embodiment of the invention.

FIG. 9 is a block diagram of a pulse modulation controller according to an embodiment of the invention.

Referring to FIG. 9, an embodiment of the pulse modulation controller 621 includes an enable controller 710, a register 720, and a digital-to-analog converter (also referred to as "DAC") 730. The enable controller 710 converts the kickback signal KB into a kickback enable signal KB_EN and outputs the kickback enable signal KB_EN.

The register 720 stores digital kickback data KB_D corresponding to the voltage level of the kickback voltage VKB. The user can change the voltage level of the kickback voltage VKB by changing the digital kickback data KB_D stored in the register 720.

The digital-to-analog converter 730 converts the digital kickback data KB_D stored in the register 720 into a kickback voltage VKB, which is a voltage signal.

Figure 10:
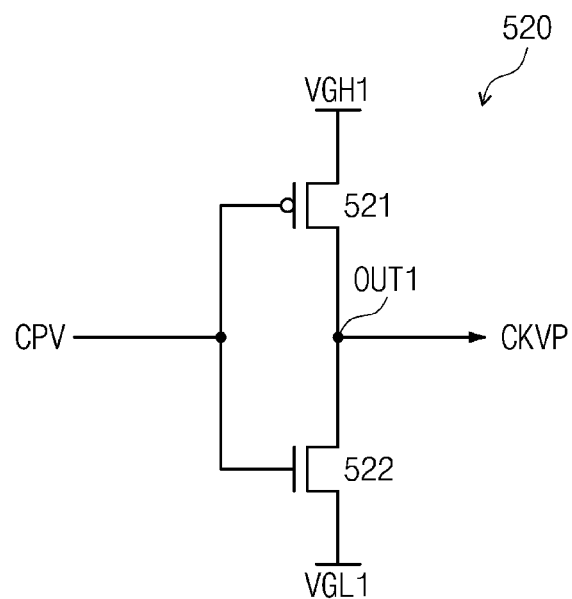
FIG. 10 is a circuit diagram of a first level shifter according to an embodiment of the invention.

FIG. 10 is a circuit diagram of a first level shifter according to an embodiment of the invention.

Referring to FIG. 10, an embodiment of the first level shifter 520 includes a first P-type transistor 521 and a first N-type transistor 522. The first P-type transistor 521 includes a first electrode connected to a first gate high voltage VGH1, a second electrode connected to the first output node OUT1, and a gate electrode receiving a gate pulse signal CPV. The gate pulse signal CPV may be provided from the timing controller 200 illustrated in FIG. 1. The first N-type transistor 522 includes a first electrode connected to the first output node OUT1, a second electrode connected to the first gate low voltage VGL1, and a gate electrode receiving the gate pulse signal CPV.

In this embodiment, the first P-type transistor 521 is a PMOS transistor, and the first N-type transistor 522 may be configured as a N-type metal-oxide-semiconductor ("NMOS") transistor or another type of transistor.

The first level shifter 520 having such a configuration generates a first gate clock signal CKVP which swings between the first gate high voltage VGH1 and the first gate low voltage VGL1 as shown in FIG. 8 in synchronization with the gate pulse signal CPV.

Figure 11:
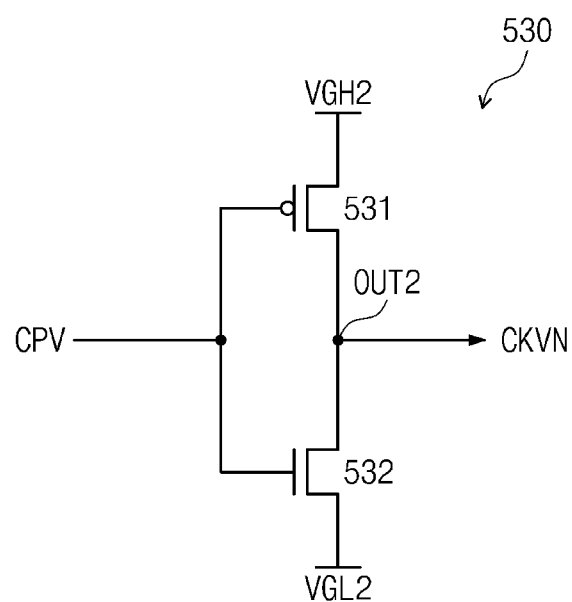
FIG. 11 is a circuit diagram of a second level shifter according to an embodiment of the invention.

FIG. 11 is a circuit diagram of a second level shifter according to an embodiment of the invention.

Referring to FIG. 11, an embodiment of the second level shifter 530 includes a second P-type transistor 531 and a second N-type transistor 532. The second P-type transistor 531 includes a first electrode connected to the second gate high voltage VGH2, a second electrode connected to the second output node OUT2, and a gate electrode receiving the gate pulse signal CPV. The gate pulse signal CPV may be provided from the timing controller 200 illustrated in FIG. 1. The second N-type transistor 532 includes a first electrode connected to the second output node OUT2, a second electrode connected to the second gate low voltage VGL2, and a gate electrode receiving the gate pulse signal CPV.

In this embodiment, the second P-type transistor 531 is a PMOS transistor, and the second N-type transistor 532 may be configured as an NMOS transistor or another type of transistor.

The second level shifter 530 having such a configuration generates a second gate clock signal CKVN which swings between the second gate high voltage VGH2 and the second gate low voltage VGL2 in synchronization with the gate pulse signal CPV, as shown in FIG. 8.

In this embodiment, the second gate high voltage VGH2 provided to the second level shifter 530 has a voltage level V(P4) of the fourth terminal P4 shown in FIG. 8.

Referring again to FIG. 8, the second gate clock signal CKVN is a pulse signal which swings between the second gate high voltage VGH2 and the second gate low voltage VGL2. In particular, the second gate clock signal CKVN includes a kickback slice gradually lowered from the second gate high voltage VGH2 to the kickback voltage VKB level at the falling edge.

The second scan driving circuit 320 illustrated in FIG. 4 outputs scan signals SN1 to SNn in synchronization with a second gate clock signal CKVN including a kickback slice. Accordingly, as shown in FIG. 5, each of the scan signals SN1 to SNn may include a kickback slice at the falling edge.

Referring again to FIG. 2, in an embodiment, as each of the scan signals SN1-SNn includes a kickback slice, the influence of the coupling capacitance between the gate-drain electrodes of the third transistor T3 can be minimized. In such an embodiment, the influence of the coupling capacitance between the gate-drain electrodes of the fourth transistor T4 can be minimized Therefore, when the scan signals SN1 to SNn transition from the high level to the low level, since the voltage of the gate electrode node GN of the first transistor T1 can minimize the variation due to the kickback voltage $\Delta V$, deterioration of display quality can be prevented.

Although the embodiments of the invention have been described in detail above, the scope of the invention is not limited thereto, and various modifications and improvements of those skilled in the art using the basic concept of the invention defined in the following claims also belong to the scope of the invention.

INDUSTRIAL APPLICABILITY

It is desired to prevent deterioration of display quality in a display device in which an LTPS semiconductor transistor and an oxide semiconductor transistor are used together in a circuit unit of one pixel. Therefore, the display device of the invention has high industrial applicability.

The invention claimed is:

1. A clock and voltage generation circuit comprising:
   a voltage generator which generates a first gate high voltage, a first gate low voltage, a second gate high voltage, and a second gate low voltage;
   a first level shifter which receives the first gate high voltage and the first gate low voltage from the voltage generator and generates a first gate clock signal which swings between the first gate high voltage and the first gate low voltage in synchronization with a gate pulse signal; and
   a second level shifter which receives the second gate high voltage and the second gate low voltage from the voltage generator and generates a second gate clock signal which swings between the second gate high voltage and the second gate low voltage in synchronization with the gate pulse signal,
   wherein the voltage generator lowers the second gate high voltage to a voltage level of a kickback reference voltage in response to a kickback signal,
   wherein the first gate low voltage and the first gate high voltage are gate-on and gate-off voltages of a transistor, respectively, and the second gate high voltage and the second gate low voltages are gate-on and gate-off voltages of another transistor, respectively.

2. The clock and voltage generation circuit of claim 1, wherein the first gate high voltage and the second gate high voltage are different voltage levels from each other.

3. The clock and voltage generation circuit of claim 1, wherein the first gate low voltage and the second gate low voltage are different voltage levels from each other.

4. The clock and voltage generation circuit of claim 1, wherein the voltage generator comprises:
a voltage converter which receives a power voltage, converts the power voltage to the first gate high voltage, the first gate low voltage, the second gate high voltage, and the second gate low voltage, and outputs the first gate high voltage, the first gate low voltage, the second gate high voltage and the second gate low voltage; and
a pulse modulation circuit which lowers the second gate high voltage to a voltage level of the kickback reference voltage in response to the kickback signal.

5. The clock and voltage generation circuit of claim 4, wherein the pulse modulation circuit comprises:
a controller which outputs a kickback enable signal and the kickback reference voltage in response to the kickback signal;
a first switching transistor including a first electrode connected to a first node to which the second gate high voltage is outputted, a second electrode connected to a second node, and a gate electrode which receives the kickback enable signal;
a comparator which compares the kickback reference voltage and a feedback voltage, and outputs a discharge signal; and
a second switching transistor including a first electrode connected to the second node, a second electrode connected to a third node, and a gate electrode which receives the discharge signal; and
a resistor connected between the third node and a ground voltage,
wherein a voltage of the third node is provided to the comparator as the feedback voltage.

6. The clock and voltage generation circuit of claim 5, wherein the controller comprises:
an enable controller which outputs the kickback enable signal corresponding to the kickback signal;
a register which stores kickback reference voltage data corresponding to the kickback reference voltage; and
a digital-to-analog converter which converts the kickback reference voltage data into the kickback reference voltage.

7. A display device comprising:
a display panel including a plurality of pixels connected to a plurality of scan lines and a plurality of data lines;
a gate driver which receives a first gate clock signal and a second gate clock signal and drives the plurality of scan lines;
a data driver which drives the plurality of data lines;
a clock and voltage generation circuit which receives a kickback signal and a gate pulse signal; and
a timing controller which controls the gate driver and the data driver, and provides the gate pulse signal and the kickback signal to the clock and voltage generation circuit,
wherein the clock and voltage generation circuit comprises:
a voltage generator which generates a first gate high voltage, a first gate low voltage, a second gate high voltage, and a second gate low voltage;
a first level shifter which receives the first gate high voltage and the first gate low voltage from the voltage generator and generates the first gate clock signal which swings between the first gate high voltage and the first gate low voltage in synchronization with the gate pulse signal; and
a second level shifter which receives the second gate high voltage and the second gate low voltage from the voltage generator and generates the second clock signal which swings between the second gate high voltage and the second gate low voltage in synchronization with the gate pulse signal,
wherein the clock and voltage generation circuit lowers the second gate high voltage to a voltage level of a kickback reference voltage in response to the kickback signal,
wherein the first gate high voltage and the second gate high voltage are different voltage levels from each other.

8. The display device of claim 7, wherein a pixel of the plurality of pixels comprises:
a light emitting diode including an anode and a cathode;
a first transistor including a first electrode connected to a first driving voltage, a second electrode electrically connected to the anode of the light emitting diode, and a gate electrode;
a second transistor including a first electrode connected to a corresponding data line among the plurality of data lines, a second electrode connected to the first electrode of the first transistor and which receives a first scan signal and a gate electrode which receives a first scan signal; and
a third transistor including a first electrode connected to the second electrode of the first transistor, a second electrode connected to the gate electrode of the second transistor, and a gate electrode connected to a second scan signal, wherein the gate driver generates the first scan signal in synchronization with the first gate clock signal, and generates the second scan signal in synchronization with the second gate clock signal.

9. The display device of claim 8, further comprising:
a fourth transistor including a first electrode connected to the gate electrode of the first transistor, a second electrode connected to an initialization voltage line, and a gate electrode which receives a third scan signal;
a fifth transistor including a first electrode connected to the first driving voltage, a second electrode connected to the first electrode of the first transistor, and a gate electrode which receives an emission control signal;
a sixth transistor including a first electrode connected to the second electrode of the first transistor, a second electrode connected to the anode of the light emitting diode, and a gate electrode which receives the emission control signal; and
a seventh transistor comprising a first electrode connected to the second electrode of the fourth transistor, a second electrode connected to the anode of the light emitting diode, and a gate electrode which receives a fourth scan signal,
wherein the gate driver generates the third scan signal in synchronization with the second gate clock signal, and generates the fourth scan signal in synchronization with the first gate clock signal.

10. The display device of claim 9, wherein the fourth transistor is an N-type transistor, and each of the fifth to seventh transistors is a P-type transistor.

11. The display device of claim 9, wherein the fourth transistor is an oxide semiconductor transistor, and each of the fifth to seventh transistors is a low-temperature polycrystalline silicon semiconductor transistor.

12. The display device of claim 8, wherein each of the first transistor and the second transistor is a P-type transistor, and the third transistor is an N-type transistor.

13. The display device of claim 8, wherein each of the first transistor and the second transistor is a low-temperature polycrystalline silicon semiconductor transistor, and
the third transistor is an oxide semiconductor transistor.

14. The display device of claim 7, wherein the first gate low voltage and the second gate low voltage are different voltage levels from each other.

15. The display device of claim 7, wherein the voltage generator comprises:
a voltage converter which receives a power voltage, converts the power voltage to the first gate high voltage, the first gate low voltage, the second gate high voltage, and the second gate low voltage, and outputs the first gate high voltage, the first gate low voltage, the second gate high voltage, and the second gate low voltage to first to fourth terminals, respectively; and
a pulse modulation circuit which lowers the second gate high voltage to the voltage level of the kickback reference voltage in response to the kickback signal.

16. The display device of claim 15, wherein the pulse modulation circuit comprises:
a controller which outputs a kickback enable signal and the kickback reference voltage in response to the kickback signal;
a first switching transistor including a first electrode connected to a first node to which the second gate high voltage is outputted, a second electrode connected to a second node, and a gate electrode connected to the kickback enable signal;
a comparator which compares the kickback reference voltage and a feedback voltage and outputs a discharge signal; and
a second switching transistor including a first electrode connected to the second node, a second electrode connected to a third node, and a gate electrode which receives the discharge signal; and
a resistor connected between the third node and a ground voltage,
wherein a voltage of the third node is provided to the comparator as the feedback voltage.

17. The display device of claim 16, wherein the controller comprises:
an enable controller which outputs the kickback enable signal corresponding to the kickback signal;
a register which stores kickback reference voltage data corresponding to the kickback reference voltage; and
a digital-to-analog converter which converts the kickback reference voltage data into the kickback reference voltage.

18. The display device of claim 7, wherein the first level shifter comprises:
a first P-type transistor including a first electrode connected to the first gate high voltage, a second electrode connected to a first output node, and a gate electrode which receives the gate pulse signal; and
a first N-type transistor including a first electrode connected to the first output node, a second electrode connected to the first gate low voltage, and a gate electrode which receives the gate pulse signal.

19. The display device of claim 7, wherein the second level shifter comprises:
a second P-type transistor including a first electrode connected to the second gate high voltage, a second electrode connected to a second output node, and a gate electrode which receives the gate pulse signal; and
a second N-type transistor including a first electrode connected to the second output node, a second electrode connected to the second gate low voltage, and a gate electrode which receives the gate pulse signal.

* * * * *